(12) United States Patent
Tzeng

(10) Patent No.: US 6,928,588 B2
(45) Date of Patent: Aug. 9, 2005

(54) SYSTEM AND METHOD OF IMPROVING MEMORY YIELD IN FRAME BUFFER MEMORY USING FAILING MEMORY LOCATION

(75) Inventor: Shrjie Tzeng, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 629 days.

(21) Appl. No.: 10/032,063

(22) Filed: Dec. 31, 2001

(65) Prior Publication Data

US 2003/0126512 A1 Jul. 3, 2003

(51) Int. Cl.⁷ .............................................. G06F 11/00
(52) U.S. Cl. ....................................... 714/42; 711/133
(58) Field of Search ........................... 714/42, 6, 7, 30, 714/53, 54, 31, 8; 711/133, 134

(56) References Cited

U.S. PATENT DOCUMENTS

| | | | | |
|---|---|---|---|---|
| 5,502,333 A | * | 3/1996 | Bertin et al. | 257/685 |
| 5,617,531 A | * | 4/1997 | Crouch et al. | 714/30 |
| 5,825,783 A | * | 10/1998 | Momohara | 714/718 |
| 6,011,734 A | * | 1/2000 | Pappert | 365/200 |
| 6,085,334 A | * | 7/2000 | Giles et al. | 714/7 |
| 6,574,763 B1 | * | 6/2003 | Bertin et al. | 714/738 |
| 2002/0157051 A1 | * | 10/2002 | Eckelman et al. | 714/736 |
| 2002/0169922 A1 | * | 11/2002 | Thomann et al. | 711/100 |

* cited by examiner

Primary Examiner—Nadeem Iqbal
(74) Attorney, Agent, or Firm—Squire, Sanders & Dempsey LLP

(57) ABSTRACT

A method is provided for testing buffer memory. The method includes a step of testing a buffer memory having a plurality of memory locations including redundant memory locations, to determine if any of the plurality of memory locations are unusable. Next, an address of an unusable memory location of the plurality of memory locations is determined. Next, the address of the unusable memory location is stored. Next, a use of the unusable memory location is prevented based on the stored address of the unusable memory location.

31 Claims, 3 Drawing Sheets

SYSTEM AND METHOD OF IMPROVING MEMORY YIELD IN FRAME BUFFER MEMORY USING FAILING MEMORY LOCATION

BACKGROUND OF THE INVENTION

1. Field of the Invention

The invention relates to systems and methods for implementing embedded memory for integrated circuits (ICs). In particular, the invention relates to systems and methods for testing and implementing embedded buffer memory within a high performance network device, such as a switch, wherein such systems and methods include testing the memory for memory failures and identifying the location of the memory failures in order to increase manufacturing yield.

2. Description of the Related Art

Integrated circuits are well known. The proliferation of computer systems is, at least in part, due to advances in designing and manufacturing ICs which allow for smaller and faster computer processor and components. Equally important to the development of computer systems are advances in memory technology which allows the production of faster and smaller memory components, including embedded and external memory devices. Such advances have fostered the competitive development and marketing of computer systems, networks and an extraordinary variety of processor-based devices. Networked computer usage has become so commonplace that it is almost impossible to find an office in the United States that does not employ several LANS (local area networks) used to facilitate its day-to-day business operations. Computer networks may include a variety of high-speed network devices, such as switches or routers, used to relay and route data from one computer station to another.

High-speed network devices like a switch, rely on external and internal (i.e., silicon-embedded) memory for performing various network functions. Competition and other market pressures have required the production of more capable network devices at lower costs. Increased network and device speed is required by customers. One way of increasing the performance of a network device is to increase the speed and reliability of its associated memory. Also, the size and packaging of the memory can effect the performance as well as the cost of the devices. However, reducing the size and increasing the speed of a device can also decrease the reliability of memory devices being mass produced, thereby decreasing the manufacturing yield and increasing the cost of each device. Accordingly, systems and methods for determining and correcting memory failures in memory devices are needed.

For example, it is known that memory failures occur more often in 0.13 $\mu$m embedded memory than compared to the rate of failure of 0.18 $\mu$m embedded memory. One way to achieve a low cost of manufacturing is to reduce the number of failures caused by the manufacturing process, which increases the manufacturing yield. One way for correcting memory failures in such memory devices is to use memory redundancy. For example, referring to FIG. 1, a system 100 may include a buffer memory 102 and a memory controller 104. Due to the reduced size of the buffer memory 102, memory failures may occur in certain rows of buffer memory 102. Accordingly, additional rows may be added during manufacturing as redundant memory. A plurality of fuses 108A may be added to system 100, which are used to selectively enable redundant memory rows as required. These fuses are connected to each redundant memory row and can store the location address of a failed memory address. A wafer test may be performed on the system to determine which rows of buffer memory 102 have failed. Then, the appropriate fuse of the plurality of fuses 108A can be blown in order to activate a redundant row to replace the failed row, thereby correcting the failure. Therefore, at a low cost, a small amount of redundant rows may be included in buffer memory 102 and the plurality of fused 108A, including as many fuses as redundant rows, may be included.

However, with a large embedded memory, such as 256 Kb, the memory yield may still be low even when a memory with row and column redundancy is used. This is because if there are additional failures that are not corrected through redundancy, the entire die (silicon chip) may need to be discarded. Therefore, new and improved systems and methods are needed for reducing or correcting failures in memory devices in order to increase manufacturing yield.

SUMMARY OF THE INVENTION

According to an embodiment of the invention, a network device is provided. The network device includes a buffer memory, a plurality of network ports, a memory controller, first and second plurality of fuses, and a built-in self test unit. The buffer memory includes a plurality of memory locations and redundant memory locations, each having an address. The memory controller is coupled to the buffer memory and configured to read and write data from and to the buffer memory. The first plurality of fuses is coupled to the redundant memory locations of the buffer memory. The second plurality of fuses is coupled to the memory controller and configured to store an address of a failed memory location of the plurality of memory locations. The built-in self test unit is coupled to the buffer memory and to the second plurality of fuses, and configured to perform a test of the buffer memory to determine an address of a failed memory location of the plurality of memory locations, and for storing the address of the failed memory location in a fuse of the second plurality of fuses. Alternatively, the built-in self test unit may generate and output address information, such as to an external program or device (i.e., off-chip) so that the failed memory location can be stored in a fuse of the second plurality of fuses. The memory controller is configured to prevent a use of the failed memory location based on the address stored in the fuse.

According to another embodiment of the present invention, a network device is provided. The network device includes a buffer memory means, a plurality of network ports, a memory controller means, first and second plurality of fuse means, and a built-in self test means. The buffer memory means includes a plurality of memory locations including redundant memory locations. The memory locations having addresses. The memory controller means is coupled to the buffer memory and for reading and writing data from and to the buffer memory means. The first plurality of fuse means is coupled to the redundant memory locations of the buffer memory means. The second plurality of fuse means is coupled to the memory controller and for storing an address of a failed memory location of the plurality of memory locations. The built-in self test means is coupled to the buffer memory means and to the second plurality of fuse means, for performing a test of the buffer memory means to determine an address of a failed memory location of the plurality of memory locations, for storing the address of the failed memory location in a fuse means of the second plurality of fuse means. Alternatively, built-in self test means may generate and output address information, such as to an external program or device, so that the failed memory location can be stored in a fuse of the second plurality of fuses. The memory controller means is for preventing a use of the failed memory location based on the address stored in the fuse means.

According to another embodiment of the present invention, a method is provided for testing buffer memory. The method includes a step of testing a buffer memory having a plurality of memory locations including redundant memory locations, to determine if any of the plurality of memory locations are unusable. Next, an address of an unusable memory location of the plurality of memory locations is determined. Next, the address of the unusable memory location is stored. Next, a use of the unusable memory location is prevented based on the stored address of the unusable memory location.

BRIEF DESCRIPTION OF THE DRAWINGS

The objects and features of the invention will be more readily understood with reference to the following description and the attached drawings, wherein.

DETAILED DESCRIPTION OF THE PREFERRED EMBODIMENTS

Figure 1:
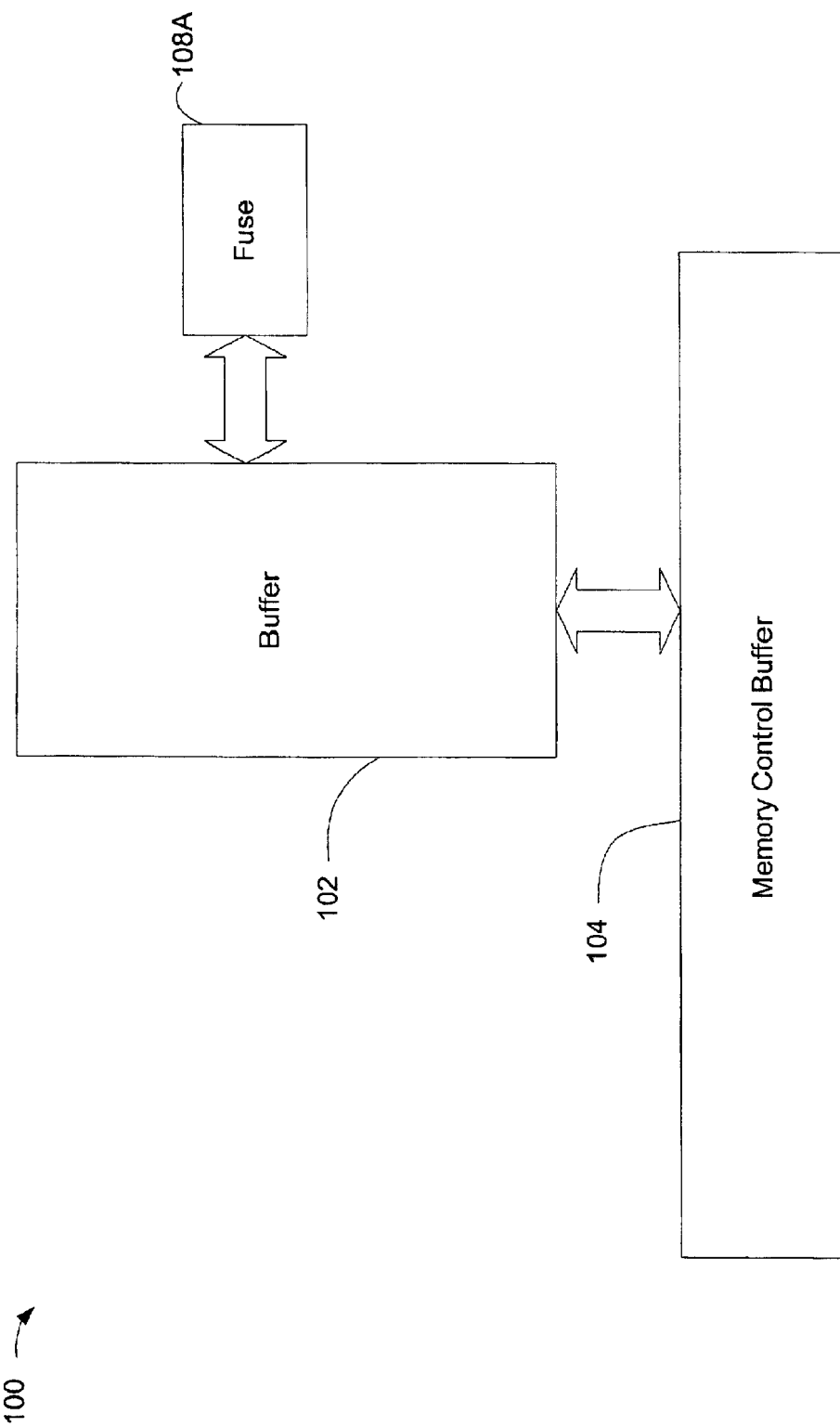
FIG. 1 is a block diagram of an memory device with redundant memory, according to the prior art.
Figure 2:
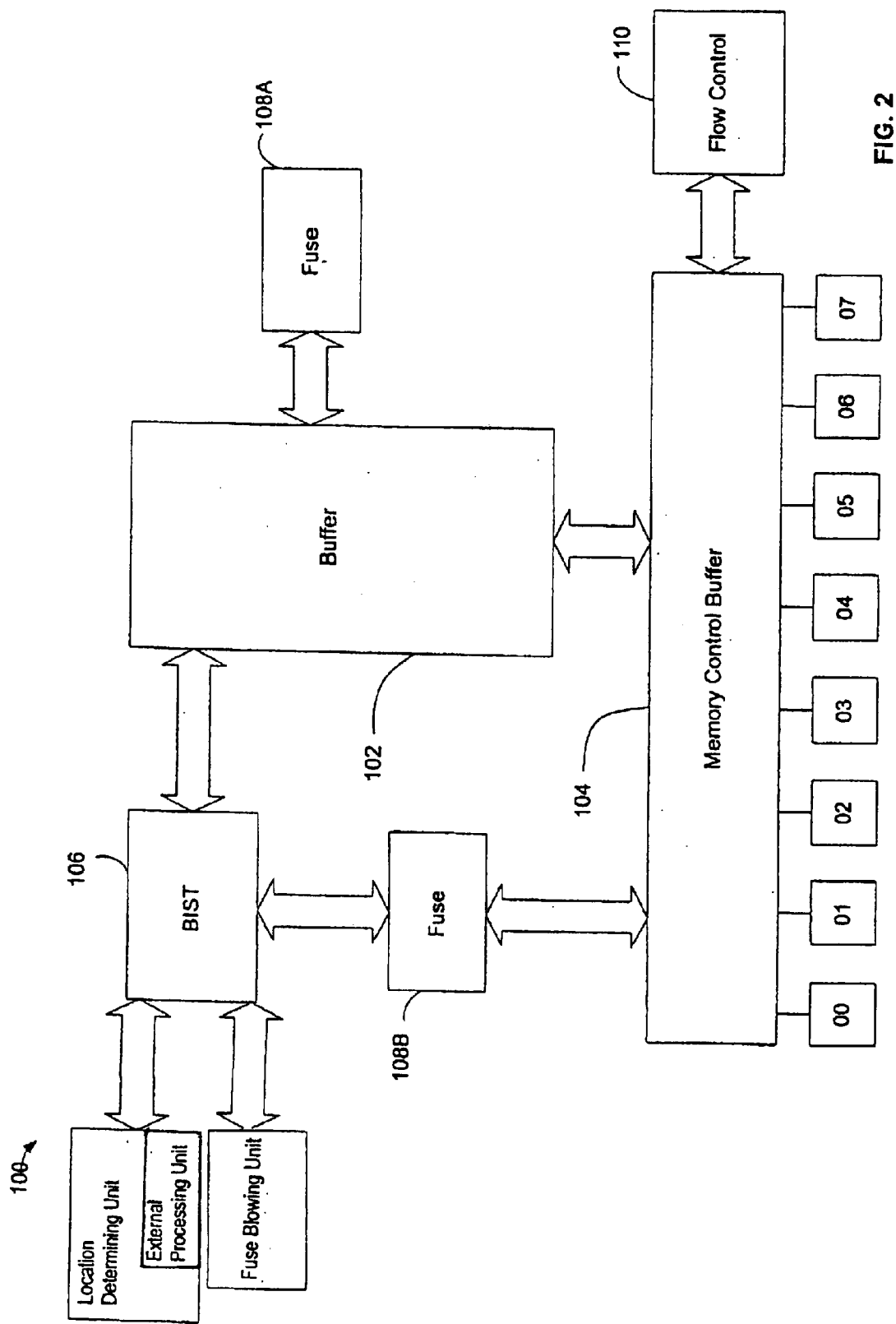
FIG. 2 is a block diagram of a memory device with redundant memory and a built-in self test unit according an embodiment of the invention.

FIG. 2 is a block diagram of a network device, such as a network switch, having embedded memory with redundant columns and rows, and a built-in self test unit in accordance with an embodiment of the present invention. System 100 includes a buffer memory 102 having some redundant memory, a buffer memory controller 104, a built-in self test unit (BIST) 106, a fuse block 108A having fuses connected to the redundant memory of buffer memory 102, a fuse block 108B, a number of network ports 0–7, and a flow control 110. The buffer memory 102 may be, for example, SRAM, DRAM or other suitable memory, and may be used to perform network functions, such as address resolution and frame data buffering. Buffer memory 102 may be used to resolve a data packet from one network port to another network port of ports 0–7. Buffer memory 102 may be used to buffer data packets as they are switched from one and, since the memory may be used for high-speed switching, is preferably, embedded memory.

A network switch may have several pieces of embedded memory, for example, one for address resolution look-up (ARL) and time multiplexing, and one for frame data buffering. The sizes of these memories can be 16K×64 bit and 32K×64 bit, respectively. Other sizes can be used, depending upon application or system requirements. For simplicity, only one memory is shown and described, but the invention is not limited as such.

The function of buffer memory 102 can be to provide a memory space to buffer all the frames (data packets) that are received by the switch. The buffer memory controller 104 is coupled to the buffer memory 102 and can be configured to control (read and write) the buffer memory 102. The flow controller 110 is coupled to each port and to buffer memory controller 104 and can be configured to request and release buffers for each port as packets are received and sent. Each port may require a number of buffer pointers from buffer memory controller 104. The buffer memory controller 104 may act as an agent to assure that each port will have unique pointers, so that one port's buffered data will not be overwritten by any other port's buffered data. The buffer memory controller 104 may be configured to process pointers so that when the buffered data is sent out of the switch, the same buffer can be reused by other ports.

BIST unit 106 is coupled to buffer memory 102 and fuse block 108B. BIST unit 106 is configured to conduct a self test for the attached memory during the wafer test process in order to determine which memory rows or columns have failed. For example, a read/write operation may be performed to test each row/column, and the test may be performed during device start-up. If any row/columns have been determined to fail, then a fuse may be blown from fuse block 108A to correct the failure. Each fuse is logically connected to a redundant row/column and can activate a redundant row/column which is built into buffer memory 102. In order to activate a redundant row/column, the appropriate fuse is blown, such as by cutting it with a laser. Each fuse may have a first bit identifying it as active or inactive, any number of bits which can be used to identify which failed row to replace. In the context of the present invention, a fuse can include one or more sub-fuses connected to internal logic, such as BIST or memory buffer logic. Each sub-fuse represents a bit, and the connected internal logic can be configured to recognize a bit as being a "1" or a "0" based on whether a sub-fuse has been cut (blown) or not. This can be accomplished through a gate array in silicon. Therefore, for ease of discussion, a fuse is considered to include one or more bits which may be set by cutting the fuse with a laser. Therefore, when a fuse is referred to as being blown or cut herein, its sub-fuses are being cut to store a binary code in bits in the fuse. The connected internal logic is able to logically read the bits of each fuse.

In one embodiment, BIST unit 106 may send the failing address and data out to the chip to an external program to interpret the failing address and data so that it can be determined which fuses to blow. For example, a PERL (Programmable Extraction Report Language) program may be used. The external program may determine which fuse to blow, or the BIST unit 106 may be configured to determine which fuse to blow. By blowing the correct fuse, the failing memory may be replaced with redundant memory. One having ordinary skill in the art will readily understand how to blow a fuse in the context of embedded memory devices.

If all the redundant memory is used (i.e., all the fuses in fuse block 108A have been blown), BIST 106 is still capable of correcting additional failures. If additional memory locations are determined to have failed, and no more redundant memory exists, BIST 106 is configured determine and transmit the necessary data off-chip so that it can be determined which fuse or fuses to blow in fuse block 108B, or to directly blow a fuse in fuse block 108B These fuses are used to identify the address of the failed row/column. Buffer memory controller 104 may be coupled to fuse block 108B and can be configured to use the addresses stored by any blown fuses therein, to identify the failed memory location and to use only memory locations that have passed the BIST for pointers or other memory functions. In other words, by determining the location of any additional failed memory locations and blowing fuses in fuse block 108B to identify the failures for the control buffer memory 104, failed row/ columns can be eliminated from the buffer memory 102. Accordingly, the buffer memory 102 may still be used even if there are more failed memory locations than existing redundant memory row/columns. Thus, with minimum logic added to the network device, many more memory units may be used than without the present invention, thereby improving manufacturing yields and reducing overall cost.

In a preferred embodiment of the present invention, with a 256 Kb frame buffer memory, 1024 buffer pointers are provided for an entire network device. Fuse block 108B contains preferably eight, sixteen or thirty-two fuses, and therefore, up to an additional thirty-two failed memory locations may be detected and corrected (i.e., blocked from being used). The total number of buffer pointers will only be reduced by thirty-two or less pointers, and a network device will have almost the same performance with a only a slight reduction in the number of buffer pointers. However, if the buffer is not corrected and a failed buffer is used, the entire device can fail because frame corruption occurs when frame data is buffered in the failing memory. Thus, the present invention provides an improved system for handling memory failures in embedded memory.

As an example, fuse block 108B can include thirty-two fuses. Each fuse is preferably eleven bits. Bit number 10 of each fuse is used to determine whether or not to enable the fuse. If this bit is set to 1, then the fuse is enabled. Bits numbered 0–9 are used to store a buffer pointer address of a failed memory location. In this example, each buffer pointer corresponds to 256 bytes of continuous buffer memory. To enable one fuse of fuse block 108B prevents the use of one buffer pointer. Accordingly, this will prevent buffer memory controller 104 from giving the corresponding buffer pointer to any port of the switch. The BIST unit 106 may be configured to prevent reporting a failied address/data to outside once a corresponding fuse has been enabled.

As described above, an external program, such as a PERL program, may be used in conjunction with BIST unit 106 to identify fuses of fuse block 108A that are attached to buffer memory 102, and the fuses of fuse block 108B that are attached to BIST unit 106 and buffer memory controller 104. Enabling a fuse from fuse block 108A allows buffer memory 102 to find a redundant memory to replace the failing memory. However, to enable a fuse from fuse block 108B prevents the BIST unit 106 and buffer memory controller 104 from reporting and/or using the corresponding buffer address stored in the fuse.

A more detailed explanation of the wafer test is as follows. The BIST unit 106 is configured to reference a fuse when reporting a failing data/address. In the fist pass of a wafer test, since all fuses in both fuse blocks 108A and 108B are disabled, BIST unit 106 will only report a first group of failing addresses before any fuses have been enabled. This approach considers the yield of fuse blowing process, which is not 100% reliable because the fuse blowing process depends significantly on the fabrication process. Since fuse block 108B is directly connected to BIST unit 106, the BIST unit 106 can be configured to only honor fuses that are successfully blown, therefore eliminating the effects of low fuse blowing yield.

The buffer memory controller 104 includes a buffer control database (not shown), and is configured to, upon start-up (i.e., after power on), fill the entire buffer control database with all zeros. In a preferred embodiment, buffer memory controller 104 uses four bits to represent the status of each buffer pointer. If all four bits are represented by zeros (i.e., '0000'), then a buffer pointer is enabled. Buffer memory controller 104 is configured to indicate when a buffer pointer has be granted to a port, such as by filling the associated record in the buffer control database with '1111'. Sometime after start-up, preferably immediately, when buffer memory controller 104 fills the buffer control database, buffer memory controller 104 will refer to the fuse information in fuse block 108B. If there is no matching buffer address in the fuse block 108B, it will write all zeros into the appropriate record. However, if there is a matching buffer address stored in a blown fuse in fuse block 108B, then the buffer memory controller 104 will fill the appropriate record in the buffer database with '1111', indicating that it is in use. Doing so will prevent buffer memory controller 104 from giving the failed address pointer to any port.

Accordingly, with thirty-two fuses in fuse block 108B, thirty-two failed buffer pointers can be eliminated. Together with the row redundancy and column redundancy in the buffer memory 102, the manufacturing yield of memory devices will be high, even in 0.13 $\mu$m technology or smaller technology.

Flow controller 110 can be coupled to the configured to account for the number of buffer pointers eliminated during failure correction. In this example, since up to thirty-two buffer pointers may be eliminated, the total number of usable pointers may be set equal to 1024 minus 32, or 992. In case, even if there are no blown fuses in fuse block 108B, the flow controller 110 will have only 992 buffer pointers available. This should ensure that all chips manufactured in accordance with the present invention will have the same performance. A user should not be able to detect the difference in performance between a network device having 1024 buffer pointers and one having 992 buffer pointers.

Figure 3:
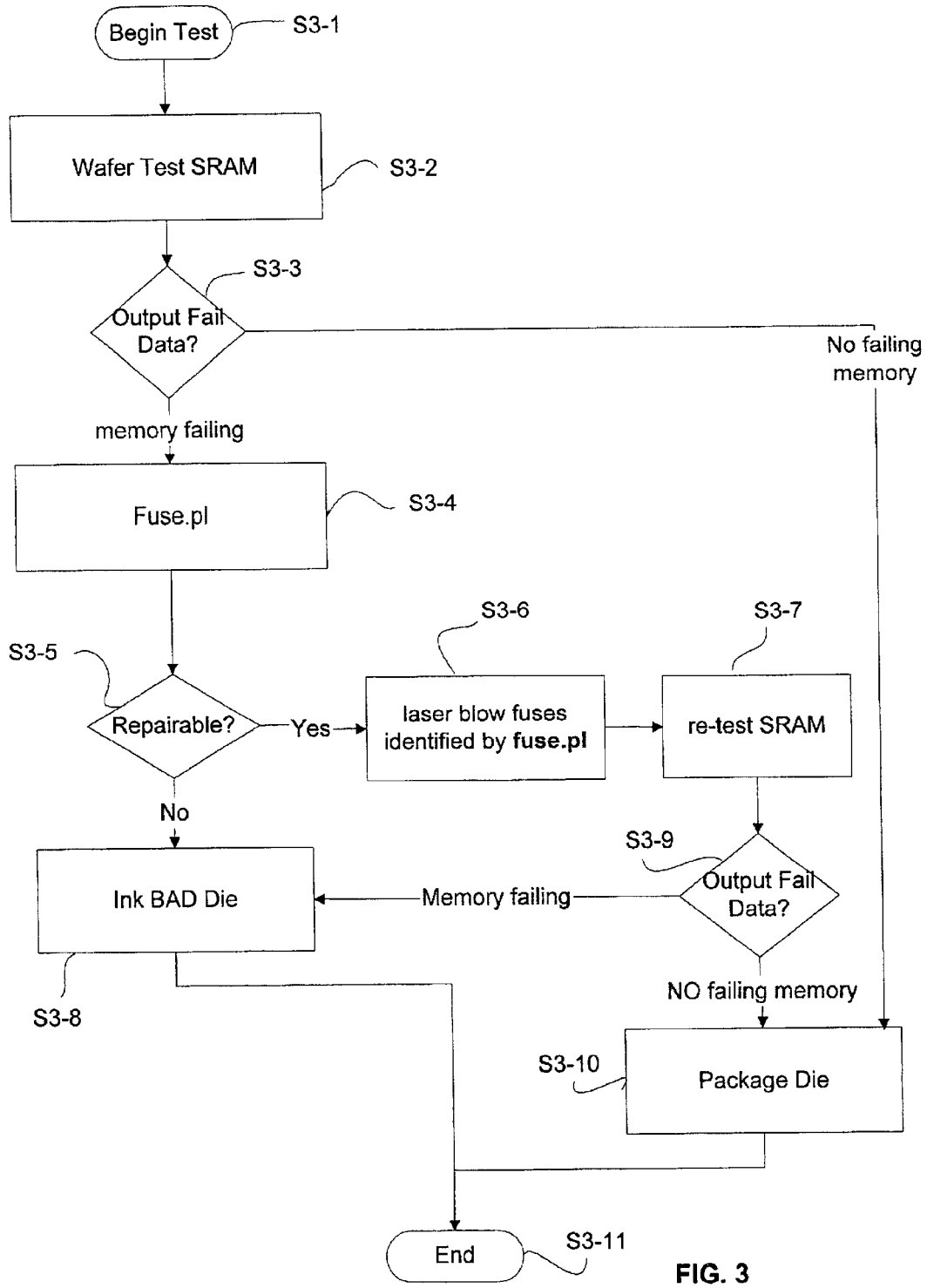
FIG. 3 is a flow chart of a method for determining and correcting memory failures in a memory device according to an embodiment of the present invention.

FIG. 3 is a flow chart of a method for testing a network device and correcting failures to embedded memory therein, according to the present invention. Processing begins at step S3-1 and proceeds to step S3-2. At step S3-2, a wafer test is performed against the memory of the network device. As explained above with reference to FIG. 2, a network device, such as a switch, may include a buffer memory, such as SRAM, which is used to perform various network functions. A BIST unit or an external program may be used to determine if any of the rows or columns of the buffer memory are bad or unusable. At step S3-3, it is determined if there are any failures. If there are no rows or columns that fail the test (i.e., are unusable), then the die (chip) is good, and processing proceeds from step S3-3 to step S3-10 where the die is packaged. If there are failed rows and columns, then processing proceeds to step S3-4, where the addresses of the failed buffer pointers is determined. As explained above, an external PERL program may be used, shown here as Fuse.pl, or the BIST unit itself may be configured to determine the buffer pointer addresses.

Next at step S3-5, it is determined whether the failed buffer pointer is repairable. For example, as described above, redundant memory may be included in the buffer memory and a fuse from a first fuse block may be blown to activate it. Once redundant memory is completely occupied, buffer failures may be corrected by identifying for the memory controller, any buffer addresses of the additional failed rows and columns. Accordingly, a second fuse block may be provided for storing the address of these additional failed memory locations, as already described above. Therefore, at step S3-6, fuses are blown associated with the addresses determined at step S3-4, and the memory is retested at step S3-7. As described above, this re-test takes into account the blown fuses, and therefore, if there are no more failures determined at step S3-9, the die is packaged at step S3-10. However, if the memory cannot be repaired at step S3-5, or if there are additional failures determined at step S3-9, such as a fuse did not blow properly, then the memory must be discarded at step S3-8 because it is determined to be a bad die.

Processing is terminated at step S3-11.

Accordingly, by the above described configurations and processes, the present invention provides novel systems and methods for improving the yield of embedded memory devices for various uses, such as network devices. The systems and methods accomplish its results by testing the memory device and correcting it for memory errors. These techniques include identifying failed buffer pointer addresses and correcting the failed buffer pointers by using redundant memory and by preventing the memory controller from using failed buffer pointers when no redundant memory is available. These systems and methods allow for memory devices, or other devices having embedded memory, to be produced having higher performance and at a higher yield.

Although the invention has been described based upon these preferred embodiments, it would be apparent to those of skilled in the art that certain modifications, variations, and alternative constructions would be apparent, while remaining within the spirit and scope of the invention. For example, any memory device may benefit from the described systems and methods for transmitting data between device. Also, other switch configurations could be used to take advantage of the invention. In order to determine the metes and bounds of the invention, therefore, reference should be made to the appended claims.

What is claimed is:

1. A network device comprising:
    a buffer memory having a plurality of memory locations including redundant memory locations, said memory locations having addresses;
    a plurality of network ports;
    a memory controller coupled to said buffer memory and configured to read and write data from and to said buffer memory;
    a first plurality of fuses coupled to said redundant memory locations of said buffer memory;
    a second plurality of fuses coupled to said memory controller and configured to store an address of a failed memory location of said plurality of memory locations; and
    a built-in self test unit coupled to said buffer memory and to said second plurality of fuses, and configured to perform a test of said buffer memory to determine an address of a failed memory location of said plurality of memory locations, and to store said address of said failed memory location in a fuse of said second plurality of fuses; and
    wherein said memory controller is configured to prevent a use of said failed memory location based on said address stored in said fuse.

2. The network device of claim 1, wherein said built-in self test unit is configured to determine an address of a second failed memory location of said plurality of memory locations and to store said address of said second failed memory location in a fuse of said first plurality of fuses associated with a redundant memory location of said plurality of memory locations, and said memory controller is configured to use said redundant memory location instead of said second failed memory location.

3. The network device of claim 1, further comprising:
    a location determining unit coupled to said built-in self test unit and configured to determine the address of failed memory locations.

4. The network device of claim 3, wherein said built-in self test unit is configured to generate address information related to failed memory locations and output said address information to said location determining unit, and said location determining unit is configured to determine which fuses to blow based on said address information.

5. The network device of claim 1, further comprising:
    a fuse blowing unit coupled to said built-in self test unit and configured to blow a fuse of said first plurality of fuses in order to enable said fuse and store an address in said fuse.

6. The network device of claim 1, further comprising:
    A flow controller coupled to said plurality of network ports and to said memory controller, and configured to request buffer pointers based on a data packet received at a network ports of said plurality of network ports;
    wherein, said memory controller is configured to provide buffer pointers to said flow controller without using any failed memory locations based on data stored in said second plurality of fuses.

7. The network device of claim 1, wherein each fuse of said second plurality of fuses include a bit for identifying if said fuse is enabled and a plurality of bits for storing an address of a failed memory location.

8. The network device of claim 1, wherein said buffer memory comprises embedded memory and said built-in self test unit is configured to perform a wafer test.

9. The network device of claim 8, wherein said buffer memory comprises 0.13 $\mu$m to 0.18 $\mu$m SRAM.

10. The network device of claim 3, wherein said location determining unit comprises an external processing unit.

11. The network device of claim 5, wherein said fuse blowing unit comprises an external fuse blowing device.

12. The network device of claim 2, wherein said device is configured to utilize all of said first plurality of fuse means before using said second plurality of fuse means.

13. A method for testing buffer memory coupled to a memory controller and a flow controller, said method comprising the steps of:
    testing said buffer memory having a plurality of memory locations including redundant memory locations, to determine if any of said plurality of memory locations are unusable;
    determining an address of a first unusable memory location of said plurality of memory locations;
    storing the address of said first unusable memory location;
    preventing a use of said first unusable memory location based on the stored address of said unusable memory locations;
    coupling said flow controller to a plurality of network ports and to said memory controller;
    requesting buffer pointers based on a data racket received at a network port of said plurality of network ports; and
    providing the buffer pointers to said flow controller without using said first unusable memory location based on the address stored in said unusable memory location.

14. The method of claim 13, further comprising steps of:
    providing a first plurality of fuses associated with said redundant memory locations;
    determining an address of a second unusable memory location of said plurality of memory locations;

storing the address of said second unusable memory location in a fuse of said first plurality of fuses associated with a redundant memory location of said plurality of memory locations; and allowing a use of said redundant memory location instead of said second failed memory location based on said fuse.

15. The method of claim 13, further comprising step of:

providing a network device having a buffer memory;

wherein said step of testing the buffer memory comprises performing a built-in test, said network device automatically performing said step for testing the buffer memory at start-up.

16. The method claim 13, further comprising a step of:

providing an address determining unit for determining addresses of unusable memory locations.

17. The method of claim 13, further comprising steps of:

determining a total number of failed memory locations;

restricting a number of buffer pointers to a number equal to a total number of memory locations minus a total number of failed memory locations.

18. The method of claim 13, wherein said storing step comprises storing said address in a fuse, said fuse including a bit for identifying if said fuse is enabled and a plurality of bits for storing an address of a failed memory location, and setting said bit for identifying if said fuse is enabled and storing said address in said plurality of bits.

19. The method of claim 13, wherein said step of testing the buffer memory comprises testing embedded memory and said testing step comprises performing a wafer test.

20. A network device comprising:

a buffer memory means having a plurality of memory locations including redundant memory locations, said memory locations having addresses;

a plurality of network ports;

a memory controller means coupled to said buffer memory and for reading and writing data from and to said buffer memory means;

a first plurality of fuse means coupled to said redundant memory locations of said buffer memory means;

a second plurality of fuse means coupled to said memory controller and for storing an address of a failed memory location of said plurality of memory locations; and a built-in self test means coupled to said buffer memory means and to said second plurality of fuse means, for performing a test of said buffer memory means to determine an address of a failed memory location of said plurality of memory locations, and for storing said address of said failed memory location in a fuse means of said second plurality of fuse means; and wherein said memory controller means is for preventing a use of said failed memory location based on said address stored in said fuse means.

21. The network device of claim 20, wherein said built-in self test means is configured to determine an address of a second failed memory location of said plurality of memory locations and store said address of said failed memory location in a fuse means of said first plurality of fuse means associated with a redundant memory location of said plurality of memory locations, and said memory controller means is configured to use said redundant memory location instead of said second failed memory location.

22. The network device of claim 20, further comprising:

a location determining means coupled to said built-in self test means and for determining the address of failed memory locations.

23. The network device of claim 22, wherein said built-in self test means generates address information related to failed memory locations and outputs said address information to said location determining means, and said location determining means determining which fuses to blow based on said address information.

24. The network device of claim 20, further comprising:

a fuse blowing means coupled to said built-in self test means, for blowing a fuse means of said first plurality of fuse means in order to enable said fuse means and store an address in said fuse means.

25. The network device of claim 20, further comprising:

a flow controller means coupled to said plurality of network ports and to said memory controller means, for requesting buffer pointer means based on a data packet received at a network ports of said plurality of network ports;

wherein said memory controller means is configured to provide buffer pointer means to said flow controller means without using any failed memory locations based on data stored in said second plurality of fuse means.

26. The network device of claim 20, wherein each fuse means of said second plurality of fuse means include a bit for identifying if said fuse means is enabled and a plurality of bits for storing an address of a failed memory location.

27. The network device of claim 20, wherein said buffer memory means comprises embedded memory means and said built-in self test means comprises a wafer test means.

28. The network device of claim 27, wherein said buffer memory means comprises 0.13 $\mu$m to 0.18 $\mu$m SRAM.

29. The network device of claim 22, wherein said location determining means comprises an external processing unit.

30. The network device of claim 24, wherein said fuse blowing means comprises an external fuse blowing device.

31. The network device of claim 22, wherein said device is configured to utilize all of said first plurality of fuse means before using said second plurality of fuse means.

* * * * *